United States Patent [19]

Iyer

[11] Patent Number: 5,817,175
[45] Date of Patent: Oct. 6, 1998

[54] METHOD OF REDUCING CARBON INCORPORATION INTO FILMS PRODUCED BY CHEMICAL VAPOR DEPOSITION INVOLVING ORGANOMETALLIC PRECURSOR COMPOUNDS

[75] Inventor: Ravi Iyer, Boise, Id.

[73] Assignee: Micron Technology, Inc., Boise, Id.

[21] Appl. No.: 506,535

[22] Filed: Jul. 25, 1995

[51] Int. Cl.$^6$ ..................................................... C30B 25/02
[52] U.S. Cl. ............................. 117/104; 117/99; 117/102; 117/103; 117/952
[58] Field of Search ..................................... 117/109, 952, 117/99, 102, 103

[56] References Cited

U.S. PATENT DOCUMENTS 5,576,071  11/1996  Sandhu ..................................... 427/534
5,607,722   3/1997  Vaartstra .............................. 427/248.1

OTHER PUBLICATIONS

Weber et al. Deposition of TiN using tetrakis(dimethylamido)–titanium in an electron resonance plasma process, Applied Physics Letters vol. 63 (3) pages 325–327, Jul. 19, 1993.

Intemann et al. "Film Properties of CVD Titanium Nitride Deposited with Organometallic Precursors at Low Pressure Using Inert Gases, Ammonia, or Remote Activation", Journal of the Electrochemical Society, vol. 140 No. 11 pp. 3215–3222, Nov. 1993.

*Primary Examiner*—Robert Kunemund
*Attorney, Agent, or Firm*—Wells, St. John, Roberts, Gregory & Matkin, P.S.

[57] ABSTRACT

A semiconductor processing method of depositing a film on a substrate using an organometallic precursor, where the precursor comprises a coordination complex having a central linking atom and at least two ligands bonded thereto, at least one of the ligands including an organic species comprising a carbon atom having at least one hydrogen atom bonded thereto thereby defining a carbon-hydrogen bond of the species, includes, a) passing a feed material through a plasma generating location effective to induce the feed material into a plasma state; b) flowing the feed material from the plasma generating location, the feed material flowing from the plasma generating location comprising a gas in an activated metastable state; c) combining an organometallic precursor with the gas when the gas is in the activated metastable state to separate the organic species from the organometallic precursor coordination complex while leaving the carbon-hydrogen bond intact, the organometallic precursor being in a gaseous non-plasma state when combined with the activated metastable state gas; and d) passing the combined precursor and gas to a substrate under conditions effective to deposit a film on the substrate, the film comprising the central linking atom.

1 Claim, 1 Drawing Sheet

METHOD OF REDUCING CARBON INCORPORATION INTO FILMS PRODUCED BY CHEMICAL VAPOR DEPOSITION INVOLVING ORGANOMETALLIC PRECURSOR COMPOUNDS

TECHNICAL FIELD

This invention relates to methods of reducing carbon incorporation into films produced by chemical vapor deposition involving organometallic precursor compounds.

BACKGROUND OF THE INVENTION

One class of compounds finding increasing use in chemical vapor deposition of electrically conductive metals and metal compounds are organometallic precursors. An example organometallic precursor is $Ti(N(CH_3)_2)_4$, named tetrakisdimethylamido titanium (TDMAT). Organometallic compounds contain a central or linking atom or ion (Ti in TDMAT) combined by coordinate bonds with a definite number of surrounding ligands, groups or molecules, with at least one of such being organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, O, P, S, Se, and Te.

An example chemical vapor deposition process is the reaction of TDMAT with nitrogen (either as $N_2$ or $NH_3$) in the presence of a carrier gas to produce TiN. Hydrogen is sometimes also utilized as a reactant gas to facilitate reaction of carbon containing radicals into stable gaseous compounds which are expelled from the reactor. An alternate process combines TDMAT and hydrogen in a plasma chemical vapor deposition reactor to deposit an elemental Ti layer on a substrate.

The above and other chemical vapor deposition reactions involving organometallics are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity. Additionally, it is believed that organic incorporation (specifically pure carbon or hydrocarbon incorporation) into the resultant film reduces density and increases resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density and poor long term reliability. Although provision of available hydrogen within the reactor is intended to restrict carbon incorporation in the resultant film, unacceptable levels of incorporated carbon typically still result.

It would be desirable to improve upon these and other prior art chemical vapor deposition processes in producing layers having minimal incorporated carbon.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of depositing a film on a substrate using an organometallic precursor, the precursor comprising a coordination complex having a central linking atom and at least two ligands bonded thereto, at least one of the ligands including an organic species comprising a carbon atom having at least one hydrogen atom bonded thereto thereby defining a carbon-hydrogen bond of the species, the method comprises the following steps:

passing a feed material through a plasma generating location effective to induce the feed material into a plasma state;

flowing the feed material from the plasma generating location, the feed material flowing from the plasma generating location comprising a gas in an activated metastable state;

combining an organometallic precursor with the gas when the gas is in the activated metastable state to separate the organic species from the organometallic precursor coordination complex while leaving the carbon-hydrogen bond intact, the organometallic precursor being in a gaseous non-plasma state when combined with the activated metastable state gas; and passing the combined precursor and gas to a substrate under conditions effective to deposit a film on the substrate, the film comprising the central linking atom.

It is theorized that undesired carbon incorporation involving organometallic precursors stems from provision of an excess of excitation energy, causing undesired cleavage of carbon-hydrogen bonds in the organometallic precursor. For example with respect to TDMAT, the bond energy for Ti—N is on the order of 5.5 eV and the bond energies for H—CH and H—$CH_2$ are 4.4 and 4.8, respectively. However the energy required to break the N—$CH_3$ of 1.7 eV is considerably lower. Application of direct plasma to TDMAT or other organometallic compounds undesirably is excessive to the point of causing cleavage of the C—H bonds of the organometallic molecule. Lower plasma excitation of the organometallic precursor would desirably provide energy sufficient to cause cleavage of some bond which would be effective to separate the organic species from the organometallic precursor while leaving the carbon-hydrogen bonds thereof intact. As an example in the case of TDMAT, if an energy of 2 eV is supplied, the Ti—N bond remains intact while the N—$CH_3$ bond will break to yield $CH_3$ free radicals which can combine with $H_2$ to form $CH_4$. In accordance with the invention, the organometallic precursor is subjected to an indirect plasma excitation.

Figure 1:
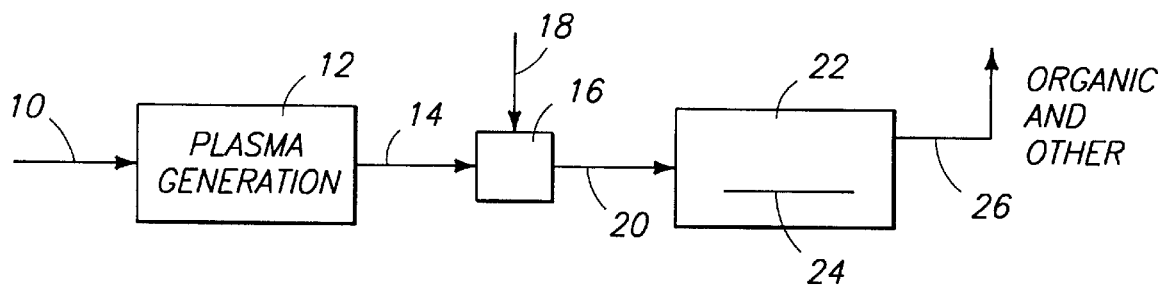
FIG. 1 is a schematic diagram of a process in accordance with the invention.

FIG. 1 illustrates an example process in accordance with the invention. A plasma generating station or location 12 includes a feedline 10. A feed material, such as argon gas, would be supplied to plasma generator 12 through line 10. Argon within plasma generator 12 would be induced into a plasma state. Plasma generator 12 includes an exit line 14 which feeds to a mixer location 16. Feed material would flow from plasma generator 12 through line 14 to mixer 16. Material flowing from plasma generator 12 would provide a gas in an activated or excited metastable state, such as Ar*. Such an excited or metastable state would be characterized by a glow discharge at the exit of plasma generator 12 due to relaxation of atoms exiting from the plasma environment, with a resultant decay of the glow downstream of generator 12. Many of the highly energetic species are lost downstream of 12 due to recombination and relaxation, leaving more lower energy excited Ar* which are fed to mixer 16.

An organometallic precursor would also be provided to mixer 16 via a line 18. The organometallic precursor would comprise a coordination complex having a central linking atom (i.e., titanium in the context of a titanium organometallic compound) and at least two ligands bonded thereto (i.e.—$N(CH_3)_2$ in the case of TDMAT). Regardless, at least one of the ligands of the coordination complex will include an organic species (i.e., $CH_3$ in TDMAT) having at least one carbon-hydrogen bond.

The organometallic precursor from line 18 and the gas from line 14 are combined under conditions whereby the gas in line 14 is still in the activated metastable state to separate the organic species from the organometallic precursor coordination complex, while leaving the carbon-hydrogen bonds intact. The organometallic precursor is provided to mixer 16 in a gaseous non-plasma state such that it is subjected to an indirect plasma by the excited version of the feed material in line 14, such as Ar*. The distance between plasma generation of the feed material and its subsequent mixing with the organometallic can be optimized, as will be appreciated by those who skill in the art, to provide the feed material at a desired excited or activated state. The principal intent or goal is to facilitate cleavage of the organic species relative to the central linking atom without cleaving carbon-hydrogen bonds.

Mixer 16 includes an exit line 20 which feeds a chemical vapor deposition reactor 22. A substrate 24 is positioned within reactor 22 The combined precursor and gas are passed via line 20 to reactor 22 under conditions effective to deposit a desired film on substrate 24 which comprises the central linking atom. Intermixing within chamber 16 effectively presents the central linking atom to reactor 22 in an elemental or compound form for desired deposition on substrate 24, while organic compounds or radicals having intact carbon-hydrogen bonds also flow to reactor 22, and ultimately out reactor exit line 26. Preferably and advantageously, the film deposited on substrate 24 which comprises the linking atom is substantially void of carbon due to most all organic material essentially exiting the reactor via line 26.

The above described schematic depicts the various sequencing of steps occurring in separate chambers. It may be more practical to conduct such steps in less than three chambers.

Example FIG. 1 conditions include an argon flow to generator 12 at from 50 sccm to 1000 sccm, and a TDMAT flow of from 1 sccm to 100 sccm. Example plasma frequency is from 400 KHz to 2.5 GHz, with example power ranging from 100 W to 400 W. Example reactor temperature and pressure are 50° C. to 700° C. and 1 mTorr to 10 Torr. Again, the intent is to subject the organometallic feed source to an indirect plasma excitation as opposed to a direct plasma. Accordingly, the distance between plasma generator 12 and mixer 16 will be optimized by people of skill in the art and will be dependent upon the level of plasma density excitation within generator 12, the frequency and the organometallic precursor being utilized. An example range of the distance between generator 12 and mixer 16 with this described example is from 2 cm to 100 cm.

Figure 2:
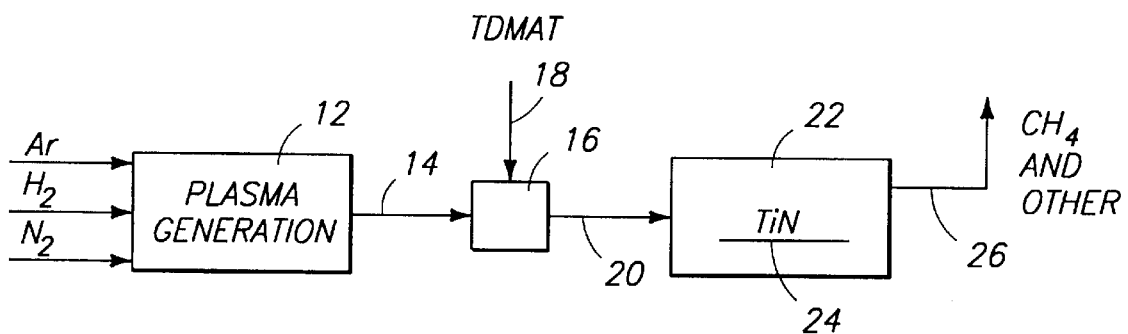
FIG. 2 is a schematic diagram of an alternate process in accordance with the invention.

FIG. 2 diagrammatically depicts a process involving TDMAT as the organometallic precursor, with titanium nitride being the deposited film. The feed material to plasma generator 12 comprises nitrogen gas, hydrogen gas, and an inert gas such as argon. Within plasma generator 12, the various components are induced into the plasma state and exit therefrom to be provided to mixer 16 in an activated metastable state. There, the components are combined with TDMAT via line 18 to separate the organic species from the TDMAT while leaving the carbon-hydrogen bonds thereof substantially intact. This will result in some generation of nitrogen gas, as well as leaving some nitrogen bonded to the previous central titanium linking atoms.

The hydrogen and nitrogen gases fed to plasma generator 12 might alternately be advantageously inserted into the process via separate lines at mixer 16, or perhaps downstream thereof in advance of chemical vapor deposition reactor 22. It might also be possible in the context of this example to feed hydrogen and nitrogen gas (i.e., no argon) to plasma generator 12, with the excitation thereof being sufficient or effective to cleave the desired bonds of the TDMAT within mixer 16.

Within CVD reactor 22, the combined precursor and feed material flowing from mixer 16 are subjected to conditions effective to deposit the titanium nitride film on substrate 24. Such conditions might include generation of plasma within reactor 22. In such instance, the organic material flowing within line 20 to reactor 22 might combine with other carbon radicals within chamber 22 in a manner such that significant carbon is not incorporated in the deposited film.

Example process parameters or conditions for the FIG. 2 embodiment would be the same as those provided above for FIG. 1, with respective ranges for the Ar, $H_2$ and $N_2$ flows being from 0 to 1000 sccm.

Figure 3:
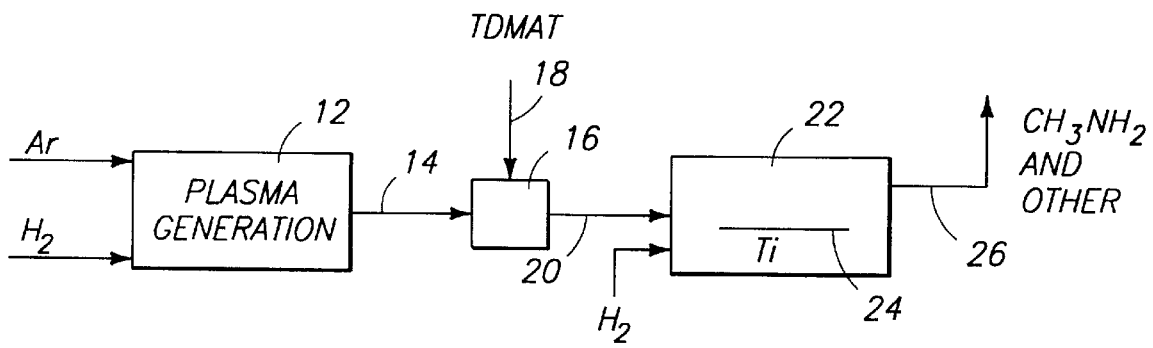
FIG. 3 is a schematic diagram of yet another alternate process in accordance with the invention.

Referring to FIG. 3, an alternate example is provided utilizing TDMAT as an organic precursor in the deposition of an elemental titanium film atop a substrate. Here, argon and hydrogen gas are preferably fed to plasma generator 12. Material exiting therefrom transforms back into a gaseous state having material thereof in an activated metastable state effective to cleave the Ti—N bonds of the TDMAT within mixer 16. The titanium flowing from mixer 16 through line 20 to CVD reactor 22 would ultimately be deposited atop substrate 24 as elemental titanium. Again, such film is preferably and advantageously substantially void of any carbon. Supplemental makeup hydrogen can be fed to CVD reactor 22, and optional plasma generation (i.e. direct plasma) might be utilized within in CVD reactor 22.

Example process parameters or conditions for the FIG. 3 embodiment would be the same as those provided above for FIG. 1, with respective ranges for the Ar and each $H_2$ flows being from 0 to 1000 sccm.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of depositing a metallic film on a substrate by utilizing an organometallic precursor comprising a coordination complex having a central linking atom and at least two ligands bonded thereto, at least one of the ligands including an organic species comprising a carbon atom having at least one hydrogen atom bonded thereto thereby defining a carbon-hydrogen bond of the species, the method comprising the following steps:

providing a feed material comprising argon;

providing a plasma generator with a exit end;

passing the feed material through the plasma generator, and the plasma generator inducing the feed material into a plasma state, the feed material leaving the plasma generator at the exit end thereof in an excited metastable state characterized by highly energetic species, such excited metastable state being characterized by a given glow discharge at the exit end of plasma generator;

providing a mixer which is connected in predetermined, remotely spaced, fluid receiving relation relative to the exit end of the plasma generator, the distance the mixer is spaced from the exit end of the plasma generator being selected such that substantially all highly energetic species, with the exception of argon, are lost as they travel in the direction of the mixer due to recombination and relaxation, the feed material arriving at the mixer with more lower energy excited argon* and a decay of the glow imparted to the feed material by the plasma generator;

providing a supply of an organo-metallic precursor in a gaseous non-plasma state to the mixer to be mixed with the lower energy excited argon* which is supplied by the plasma generator, the distance the mixer is spaced from the exit end of the plasma generator being further selected such that the energy level of the lower energy argon* facilitates cleavage of the organo-metallic precursor without substantially cleaving carbon-hydrogen bonds therein;

providing a chemical vapor deposition reactor having a substrate positioned therein;

coupling the chemical vapor deposition reactor in fluid flowing relation relative to the mixer, the remotely positioned mixer located a given distance from the chemical vapor deposition reactor and further facilitating the mixing of the organo-metallic precursor and the lower energy excited argon*; and subjecting the mixed organo-metallic precursor and the lower energy excited argon* of the feed material to conditions within the chemical vapor deposition reactor to deposit a metallic film on the substrate which is substantially devoid of carbon deposits.

* * * * *